(12) United States Patent
Fredriksson

(10) Patent No.: US 9,521,903 B2
(45) Date of Patent: Dec. 20, 2016

(54) RACK MODULE

(75) Inventor: Daniel Fredriksson, Jorlanda (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 249 days.

(21) Appl. No.: 13/882,966

(22) PCT Filed: Nov. 3, 2010

(86) PCT No.: PCT/EP2010/066742
§ 371 (c)(1),
(2), (4) Date: May 1, 2013

(87) PCT Pub. No.: WO2012/059127
PCT Pub. Date: May 10, 2012

(65) Prior Publication Data
US 2013/0240469 A1 Sep. 19, 2013

(51) Int. Cl.
*A47B 81/00* (2006.01)
*H04Q 1/02* (2006.01)
*H05K 7/14* (2006.01)

(52) U.S. Cl.
CPC ............... *A47B 81/00* (2013.01); *H04Q 1/09* (2013.01); *H05K 7/1425* (2013.01)

(58) Field of Classification Search
CPC .... H05K 7/1425; H05K 7/1424; H05K 7/183; H05K 7/186; H04Q 1/09; A47B 81/00
USPC ... 211/26; 312/334.1, 334.4, 334.5; 385/135
See application file for complete search history.

(56) References Cited

U.S. PATENT DOCUMENTS

| | | | | |
|---|---|---|---|---|
| 2,189,993 | A * | 2/1940 | Ramsey | 211/26 |
| 3,986,318 | A * | 10/1976 | McConnell | 403/384 |
| 5,971,507 | A * | 10/1999 | Peroni | 312/223.2 |
| 6,095,345 | A * | 8/2000 | Gibbons | 211/26 |
| 6,123,203 | A * | 9/2000 | Gibbons | 211/26 |
| 6,269,959 | B1 * | 8/2001 | Haworth | 211/26 |
| 6,439,523 | B1 * | 8/2002 | Chandler et al. | 248/300 |
| 6,462,961 | B1 * | 10/2002 | Johnson et al. | 361/825 |
| 6,481,582 | B1 * | 11/2002 | Rinderer | 211/26 |
| 6,597,576 | B1 * | 7/2003 | Smith et al. | 361/724 |
| 6,677,520 | B1 * | 1/2004 | Kim et al. | 174/50 |
| 6,751,091 | B2 * | 6/2004 | Dighde et al. | 361/679.02 |
| 6,804,447 | B2 * | 10/2004 | Smith et al. | 385/134 |
| 7,308,184 | B2 * | 12/2007 | Barnes et al. | 385/135 |
| 7,499,623 | B2 * | 3/2009 | Barnes et al. | 385/135 |
| 7,916,502 | B2 * | 3/2011 | Papakos et al. | 361/826 |
| 8,042,777 | B2 * | 10/2011 | Ruiz et al. | 248/235 |
| 8,705,926 | B2 * | 4/2014 | Giraud et al. | 385/135 |
| 8,870,135 | B2 * | 10/2014 | Grubbs | 248/200 |
| 2004/0013390 | A1 * | 1/2004 | Kim et al. | 385/135 |
| 2009/0184072 | A1 | 7/2009 | Fischer et al. | |

(Continued)

*Primary Examiner* — Patrick Hawn
(74) *Attorney, Agent, or Firm* — Rothwell, Figg, Ernst & Manbeck, P.C.

(57) ABSTRACT

The invention refers to a rack module comprising a first plate on one side of the module and a second plate on the other side of the module. The planes of the plates are parallel to one another, and each of the plates comprises two holes for a fastening device, for fastening of the rack module to a rack cabinet. The holes are arranged such that they make the corners of a quadrangle. The first and second plates each comprise two oblong holes, each of the oblong holes is arranged in connection with one of the other holes such that the oblong holes are parallel with each other.

24 Claims, 2 Drawing Sheets

(56) References Cited

U.S. PATENT DOCUMENTS

2010/0244641 A1    9/2010  Bergesch et al.
2011/0268412 A1*  11/2011  Giraud et al. ............... 385/135
2011/0317974 A1*  12/2011  Krampotich et al. ........ 385/135

* cited by examiner

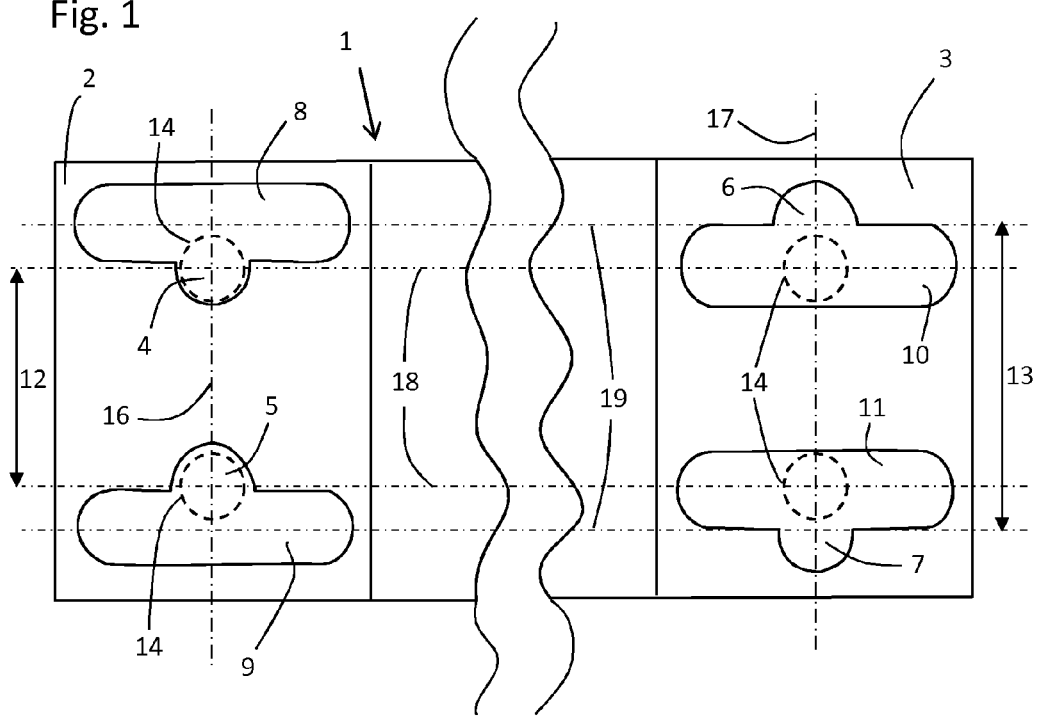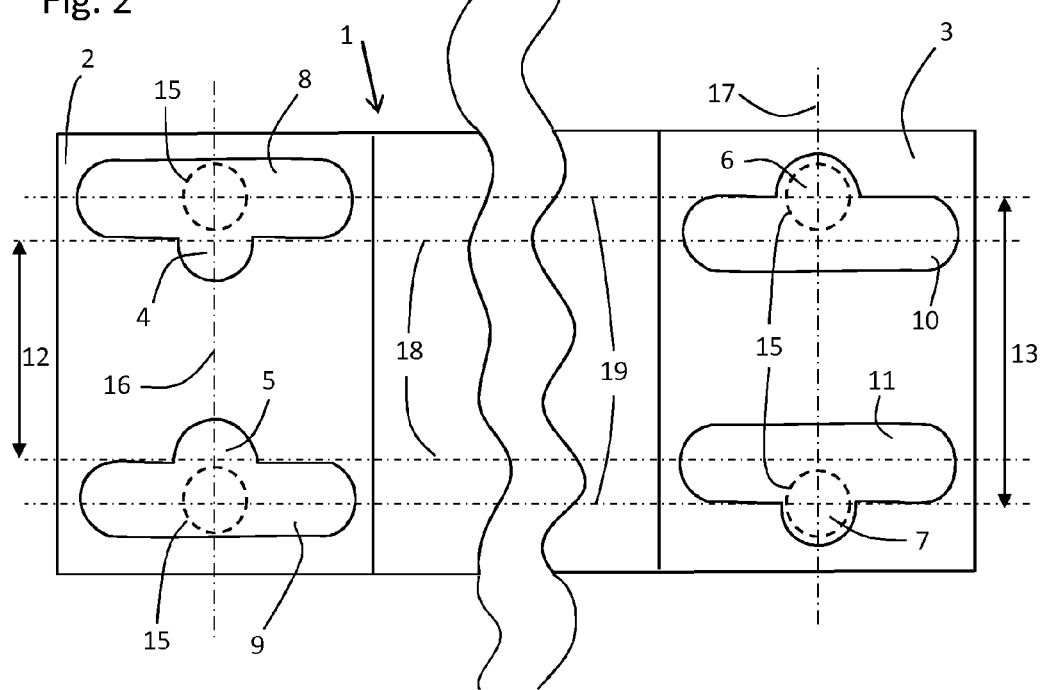

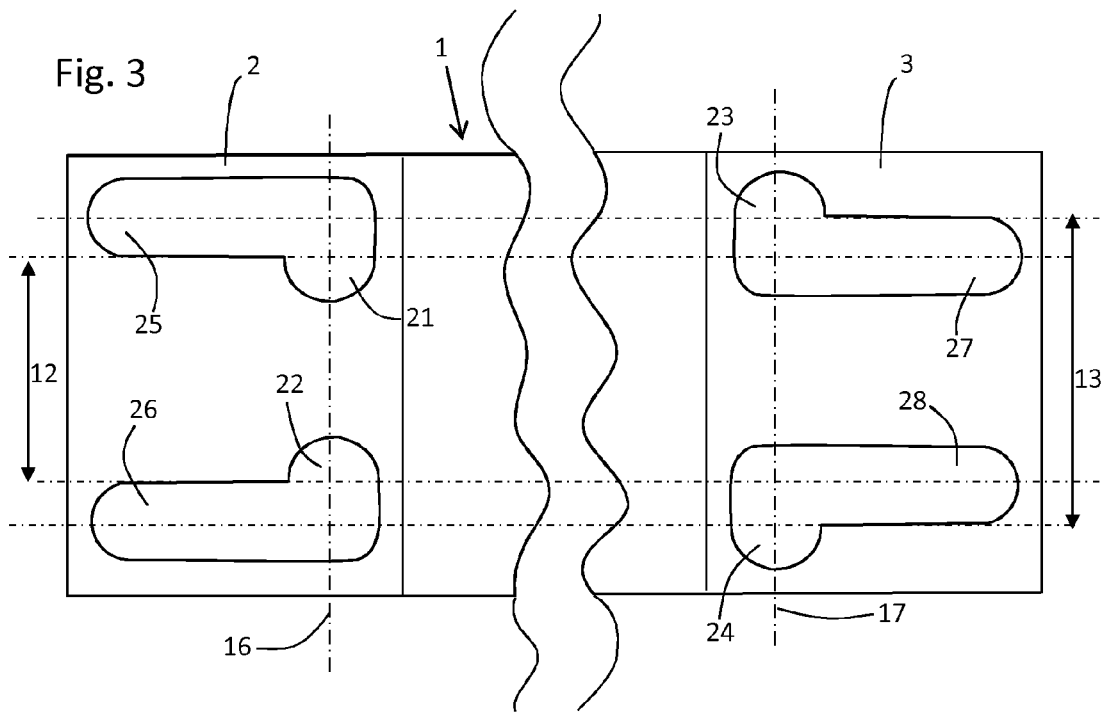
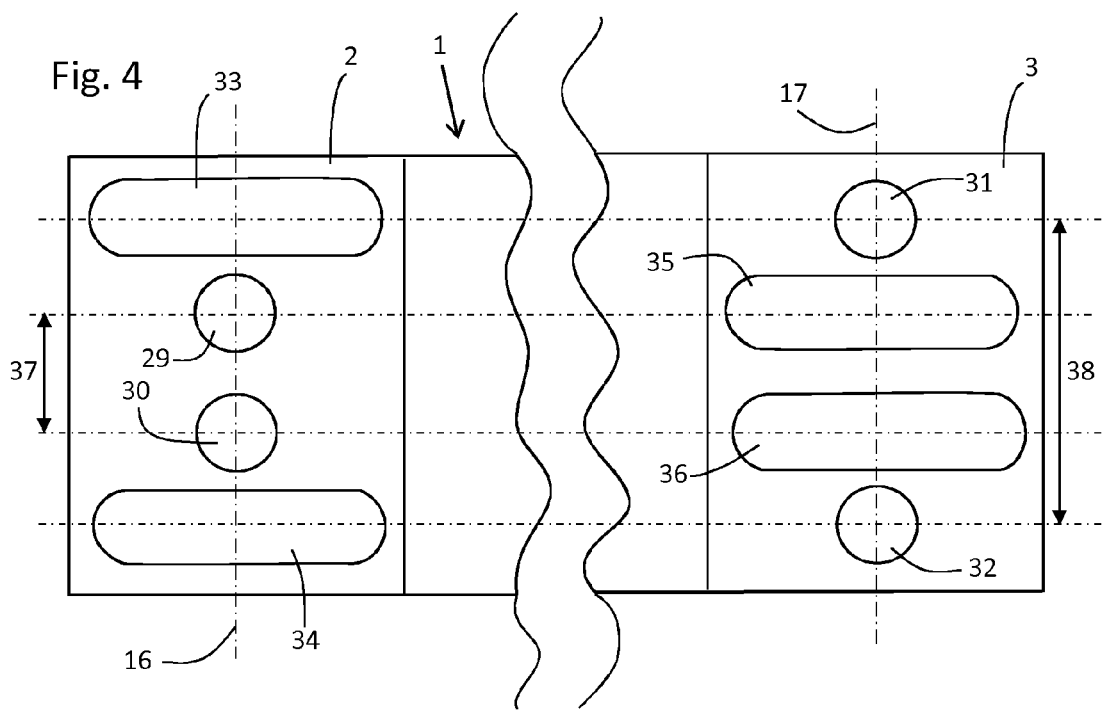

RACK MODULE

CROSS REFERENCE TO RELATED APPLICATION(S)

This application is a 35 U.S.C. §371 National Phase Entry Application from PCT/EP2010/066742, filed Nov. 3, 2010, designating the United States, the disclosure of which is incorporated herein in its entirety by reference.

TECHNICAL FIELD

The present invention relates to a rack module comprising a first plate on one side of the module, a second plate on the other side of the module. The planes of the plates are parallel to one another, wherein each of the plates comprises two holes for a fastening device, for fastening of the rack module to a rack cabinet. The holes are arranged such that they make the corners of a quadrangle.

BACKGROUND

Cabinets/racks for installation of 19" (inch) wide telecom equipment are designed to fit units of multiples of 44.45 or 50 mm in height depending on referenced standard. The 19" is generally the maximum width of a unit. To make this possible the vertical hole pattern along the sides of the rack aperture have holes according to different standards.

There are two dominant standards for vertical hole pitches. One is based on inches, the so called ANSI-standard (American National Standards Institute). The other widely used standard is based on mm, the so called ETSI-standard (European Telecommunications Standards Institute). The ANSI-standard has its holes separated 1.25" (31.75 mm) apart and in the ETSI-standard the holes are separated by 25 mm. The horizontal c-c distance is generally 465.1 mm for both the above standards.

Since ANSI and ETSI racks apart from pitch share about the same height and width limitations, it is desirable to design a rack module which is possible to mount no matter which of the two standards are used on the cabinet/rack.

A traditional way of solving the problem of having two standards is by having fastening brackets that are exchangeable, i.e. having one ANSI-bracket and one ETSI-bracket. A somewhat more sophisticated way of solving the problem is to have an oblong hole or groove sufficiently long to cover the standards. In the example of ANSI and ETSI the length of the hole would be (31.75 mm−25 mm)/2=3.375 mm adding at least the diameter of the bolt/screw to be used.

As large structures such as cabinets/racks are built up by a number of parts that are welded or screwed together it is not hard to imagine that it's difficult to maintain a specific width within tolerances all along the front opening when each part contributes with some kind of slack. The variation in sizes of the parts is often a result of the various production methods. For instance, a rack module might be made of a bent metal sheet or assembled from several parts which add to the variation in c-c distance of the fastening holes, especially in the horizontal direction. A way of overcoming the variations is again to make oblong holes or grooves but this time horizontally.

SUMMARY OF THE INVENTION

With existing 19" unit designs it is not possible to mount into both "inch"- and "mm"-racks, when either the cabinet/rack and/or rack modules mounting holes vary both horizontally and vertically without extra accessories. In order to compensate for two standards, i.e. the c-c distance vertically, and the variations horizontally it is necessary to have holes that are relatively large. A standard screw with a normal sized head therefore affects the positioning of the rack module since only a very small part of the screw head contact surface actually is in contact with the rack module to be fastened to the cabinet/rack, if any at all.

The object of the invention is therefore to provide for a solution that gives a tighter fit of a rack module to a cabinet/rack regardless of c-c standard and variations due to production method. This object is achieved by a rack module as set forth in the appended claims.

Preferably, the rack module according to the present invention comprises a rack module comprising a first plate on one side of the module, a second plate on the other side of the module. The planes of the plates are parallel to one another, wherein each of the plates comprises two holes for a fastening device, for fastening of the rack module to a rack cabinet. The holes are arranged such that they make the corners of a quadrangle.

The first plate further comprises two oblong holes, each of the oblong holes being arranged in connection with one of the other holes such that the oblong holes are parallel with each other. Each of the oblong holes is arranged on the farther side of the connected hole, relative the other hole on the first plate with which it is not connected. The second plate further comprises two oblong holes, each of the oblong holes being arranged in connection with one of the other holes such that the oblong holes are parallel with each other Each of the oblong holes is arranged on the nearer side of the connected hole, relative the other hole on the second plate with which it is not connected.

With rack module is meant a rack unit, rack tray or rack chassis in which could be mounted a variety of electronics.

The length of the oblong horizontal holes, used in common prior art designs regardless of pitch, is normally quite large compared to what is actually needed in reality. The present invention instead "fixes" the rack module at one side using holes and the oblong holes are instead used on the other side or plate. By having holes on one side plate for a first standard a holes on the other side for a second standard in combination with oblong holes according to the present invention, it is possible to have one rack module that fit two standards and at the same time allowing for normal length variations in the horizontal direction without losing substantial contact surface between the screw heads and the side plates of the rack module.

Thus, by having the possibility of compensating the differences in c-c dimensions between cabinet/rack and rack module, the holes can be made with a smaller diameter compared to the standard vertical or horizontal oblong holes used since the large diameter/area of the holes in prior art is used in order to compensate or slightly improve variations in c-c dimensions.

Accordingly, by decreasing the area of the hole, the contact area for the bolt, or rather the head of the bolt, is increased and thus improving the joint or fixture of the rack module to the cabinet/rack.

In a rack module according to the present invention the distance between the centres of the holes on the first plate equals the distance between the centre lines of the oblong holes of the second plate and the distance between the centres of the holes on the second plate equals the distance between the centre lines of the oblong holes of the first plate. Thus, when mounting the rack module according to the present invention the side plate which has the holes with a c-c distance corresponding to the standard of the cabinet/rack is mounted first and the oblong holes on the other side plate will allow for fastening of the rack module no matter if the c-c distance varies horizontally. In some cases it might however be more practical to first fasten the rack module to the cabinet with one bolt/screw on each side to "free" one hand from holding the rack module.

Preferably the holes are circular. This is beneficial both from a production point as well as the reliability of a secure attachment of the rack module to the cabinet/rack. There are generally more options available for achieving a circular hole or opening than for instance a square shaped hole. This also generally means that production cost can be minimized, at least when using a cutter. Also, since screws/bolts are normally used as fastening devices, the threaded part being circular, their heads will have a maximised contact surface area with the rack module.

According to one aspect of the invention the diameter of the holes equals the width of the oblong holes. Again, this is beneficial from a production point since the same tool for making the hole can be used to make the oblong holes. Further, even though some contact surface area is lost compared to a circular hole it is still sufficient for a secure fixing of the rack module to the cabinet/rack.

According to another aspect of the invention the diameter of the holes is smaller than the width of the oblong holes. In some cases the sides of the cabinet/rack might not be perfectly aligned or the rack modules might not be perfectly "straight". By having a play for the screw/bolt in the oblong holes the width of the oblong holes being larger than the diameter of the holes can compensate for such variations as mentioned above or if the manufactured oblong holes for some reason are not exactly parallel.

According to yet another aspect of the invention the hole and its connected oblong hole form one aperture. To some extent this depends on the two standards that are combined for the rack module. In the case with the ANSI-standard and the ETSI-standard being combined the difference in c-c distance vertically between the standards is only 6.75 mm. This difference in relation to the dimensions of the screws/bolts really leaves no other option. However, the mounting of the rack module on the cabinet/rack will at least partially be facilitated by this "combined" aperture. With the solution of the present invention the aperture will still be sufficiently small to provide for a secure fixing of the rack module to the cabinet/rack, i.e. sufficient contact area between bolt/screw head and the plate.

Preferably, the holes are arranged at the centre of one long side of the oblong holes. This allows for maximum variations in both directions in the c-c distance horizontally.

However, in some situations it is preferred to have the holes arranged off-centre at one long side of the oblong holes. This is the case when for instance a specific cabinet/rack is used which might be slightly wider, or when the c-c distance is expected to grow. Thus, it would be possible to make the oblong holes shorter and possibly increasing the contact surface area between the screw or bolt head and the side plates of the rack module.

Preferably, the vertical distance between the centres of the holes on one of the plates is 25 mm. This corresponds to the c-c distance of the ETSI-standard.

Also preferable is that the vertical distance between the centres of the holes on one of the plates is 31.75 mm (1.25"). This corresponds to the c-c distance of the ANSI-standard.

More preferable is that the vertical distance between the centres of the holes on one of the plates is 25 mm and that the vertical distance between the centres of the holes on the other plate is 31.75 mm (1.25"). A rack module according to the invention with the above mentioned measures thus could be used for a majority of the 19" cabinets/racks used at present.

According to one aspect of the invention the first plate and the second plate lie in the same plane. This is the most common design but the invention could also be used where the planes of the plates are displaced but still parallel.

Preferably, the rack module height is less than 44.45 mm. The pitch between two groups of holes is 44.45 mm in the ANSI-standard and 50 mm in the ETSI-standard. Thus, in order to be able to have rack modules that fit the ANSI-standard cabinets/racks their height should be less than the pitch, i.e. 44.45 mm.

Further, the alignment of the holes on the first plate is preferably parallel to the alignment of the holes on the second plate. However, there could be situations where a tighter fit would be desirable and this tighter fit could be made for instance by not having parallel alignments. The more natural or logical solution for a tighter fit would however instead be to have smaller tolerances for the holes and oblong holes.

BRIEF DESCRIPTION OF THE DRAWINGS

The invention will below be described in connection to the drawings in which:

FIG. 1 schematically shows a partial front view of a first embodiment of a rack module according to the present invention.

FIG. 2 schematically shows a partial front view of a first embodiment of a rack module according to the present invention FIG. 3 schematically shows a partial front view of an alternative embodiment of a rack module according to the present invention.

FIG. 4 schematically shows a partial front view of a further alternative embodiment of a rack module according to the present invention.

DETAILED DESCRIPTION

FIG. 1 shows a rack module 1 according to the present invention. The rack module 1 further comprises a first plate 2 on one side and a second plate 3 on the other side. The planes of the plates 2, 3 are parallel to one another and the planes in this embodiment are actually in one and the same plane.

The plates 2, 3 comprise two holes 4, 5, 6, 7, 21, 22, 23, 24, 25, 29, 30, 31, 32 for a fastening device, respectively, for fastening of the rack module 1 to a rack cabinet (not shown). The holes 4, 5, 6, 7, 21, 22, 23, 24, 25, 29, 30, 31, 32 are arranged or positioned such that they make the corners of a quadrangle.

Each of the holes 4, 5 on the first plate 2 has an oblong hole 8, 9 in a straight line in connection with the hole 4, 5 such that the oblong holes 8, 9 are parallel with each other. They are further arranged on the side of the hole 4, 5 such that they are facing away from the hole 4, 5 on the first plate 2 with which they are not connected.

Each of the holes 6, 7 on the second plate 3 has an oblong hole 10, 11 in a straight line in connection with the hole 6, 7 such that the oblong holes 10, 11 are parallel with each other and arranged on the side of the hole 6, 7 such that they are facing towards the hole 6, 7 on the second plate 3 with which they are not connected.

In the embodiment of FIG. 1 the rack module 1 has a distance between the centres of the holes 4, 5 on the first plate 2 that equals the distance between the centre lines of the oblong holes 10, 11 of the second plate 3. In a corresponding way the distance between the centres of the holes 6, 7 on the second plate 3 equals the distance between the centre lines of the oblong holes 8, 9 of the first plate 2. However, there could be situations where there are different standards for each side, for instance, in order to certify that the rack modules are not mounted upside down.

The holes 4, 5, 6, 7 are circular and the diameter of the holes 4, 5, 6, 7 equals the width of the oblong holes 8, 9, 10, 11. However, in an alternative embodiment the diameter of the holes 4, 5, 6, 7 is smaller than the width of the oblong holes 8, 9, 10, 11.

In the embodiment shown in FIG. 1 the hole 4, 5, 6, 7 and its connected oblong hole 8, 9, 10, 11 form one aperture 4,8; 5,9; 6,10; 7,11. In the two most commonly used standards, i.e. the ANSI-standard and the ETSI-standard the c-c distance do not differ more than the diameter of the screw or bolt to be used for fastening the rack module 1 to the cabinet/rack. Thus, the embodiment in FIG. 1 displays this situation.

Also, as can be seen from FIG. 1, the holes 4, 5, 6, 7 are arranged at the centre of one side of the oblong holes 8, 9, 10, 11. However, there are situations where it might be beneficial to have the holes arranged off-centre of one side of the oblong holes.

The embodiment shown in FIG. 1 is a schematic depiction of the rack module according to the present invention having the two standards most commonly used, i.e. the ANSI-standard and the ETSI-standard. Thus, the distance 12 between the centres of the holes 4, 5 on the first plate 2 is 25 mm and the distance 13 between the centres of the holes 6, 7 on the second plate 3 is 31.75 mm (1.25"). In FIG. 1 the rack module 1 is shown in relation to holes 14 on the cabinet corresponding to the ETSI-standard.

The holes 4, 5 on the first plate 2 are vertically aligned 16 and the holes 6, 7 on the second plate 3 are also vertically aligned 17. Further, the holes 4, 5 on the first plate 2 are horizontally aligned 18 with the oblong holes 10, 11 on the second plate 3 and the holes 6, 7 on the second plate are horizontally aligned 19 with the oblong holes 8, 9 on the first plate 2.

Upon mounting a rack module 1 as in FIG. 1 in a cabinet or rack according to the ETSI-standard, the idea of the invention is first to fix the rack module 1 on the left side. Thus, the holes 4, 5 on the left side are first used to fix the rack module 1 to the cabinet/rack and thereafter screws or bolts are used to fix the rack module 1 on the right side using the oblong holes 10, 11 since the distance 12 between the holes in the cabinet/rack should be 25 mm.

Alternatively, a screw or a bolt could be used with the lower hole 5 on the left side to start with and the second bolt is used in the lower oblong hole 11 on the right side in order to avoid the rack module just hanging on one side upon mounting. Also, by starting with the lower hole 5 on the left side and the lower oblong hole 11 on the right side the rack module 1 will immediately be in the correct position vertically or at least as close as possible after only using two screws/bolts of total of four.

In FIG. 2 the rack module 1 is the same as the one shown in FIG. 1 but now shown in relation to holes 15 on the cabinet corresponding to the ANSI-standard.

Thus, in a similar way as previously described with the ETSI-standard, upon mounting a rack module 1 as in FIG. 1 in a cabinet or rack but now instead according to the ANSI-standard, the idea of the invention is first to fix the rack module 1 on the right side. Thus, the holes 6, 7 on the right side are first used to fix the rack module 1 to the cabinet/rack and thereafter screws or bolts are used to fix the rack module 1 on the left side using the oblong holes 8, 9 since the distance 13 between the holes in the cabinet/rack should be 31.75 mm (1.25").

Alternatively, a screw or a bolt could be used with the upper hole 6 on the right side to start with and the second bolt is used in the upper oblong hole 8 on the left side in order to avoid the rack module just hanging on one side upon mounting. Also, by starting with the upper hole 6 on the right side and the upper oblong hole 8 on the left side the rack module 1 will immediately be in the correct position vertically or at least as close as possible after only using two screws/bolts of a total of four.

FIG. 3 shows an alternative embodiment of the rack module 1 according to the present invention. The holes 21, 22, 23, 24 are placed off-centre relative the oblong holes 25, 26, 27, 28. There is however a vertical alignment 16, 17 of the holes 21, 22, 23, 24 on both plates 2, 3. Further, the distance 12, 13 between the holes are the same as in FIGS. 1 and 2.

In FIG. 4 is shown yet another embodiment of the rack module 1 according to the present invention. The c-c distance 37, 38 vertically differ in this case between the two standards that much such that each hole 29, 30, 31, 32 do not form a joint aperture with its connected oblong hole 33, 34, 35, 36. The pair of holes 29, 30, 31, 32 on each plate 2, 3 are in the shown embodiment vertically aligned 16, 17.

The foregoing is a disclosure of preferred embodiments for practicing the present invention. However, it is apparent that incorporating modifications and variations will be obvious to one skilled in the art. Inasmuch as the foregoing disclosure is intended to enable one skilled in the art to practice the instant invention, it should not be construed to be limited thereby, but should be construed to include such modifications and variations as fall within the scope of the claims.

The invention claimed is:

1. A rack module comprising:
  a first plate including a first hole formed by a first oblong region and a first circular region and a second hole formed by a second oblong region and a second circular region; and
  a second plate including a third hole formed by a third oblong region and a third circular region and a fourth hole formed by a fourth oblong region and a fourth circular region,
  wherein:
    a first circular distance is defined between a center of the first circular region and a center of the second circular region;
    a second circular distance is defined between a center of the third circular region and a center of the fourth circular region;
    the first circular distance is less than the second circular distance;
    a first oblong distance is defined between a center of the first oblong region and a center of the second oblong region;
    a second oblong distance is defined between a center of the third oblong region and a center of the fourth oblong region;
    the first circular distance equals the second oblong distance; and
    the second circular distance equals the first oblong distance.

2. The rack module of claim 1, wherein:
  the first circular region is vertically aligned with the second circular region, and the third circular region is vertically aligned with the fourth circular region.

3. The rack module of claim 1, wherein:
the first circular region is horizontally aligned with the third oblong region, wherein a center of the first circular region lies on a first line extending from the longitudinal axis of the third oblong region;
the third circular region is horizontally aligned with the first oblong region, wherein a center of the third circular region lies on a second line extending from the longitudinal axis of the first oblong region;
the second circular region is horizontally aligned with the fourth oblong region wherein a center of the second circular region lies on a third line extending from the longitudinal axis of the third oblong region; and
the fourth circular region is horizontally aligned with the second oblong region, wherein a center of the fourth circular region lies on a fourth line extending from the longitudinal axis of the second oblong region.

4. The rack module of claim 1, wherein a diameter common to each of the first circular region, the second circular region, the third circular region, and the fourth circular region equals a width common to each of the first oblong region, the second oblong region, the third oblong region, and the fourth oblong region.

5. The rack module of claim 1, wherein each of the first circular region, the second circular region, the third circular region, and the fourth circular region is arranged at a center along the longitudinal axis of the corresponding first oblong region, second oblong region, third oblong region, and fourth oblong region.

6. The rack module of claim 1, wherein each of the first circular region, the second circular region, the third circular region, and the fourth circular region is arranged at an end along the longitudinal axis of the corresponding first oblong region, second oblong region, third oblong region, and fourth oblong region.

7. The rack module of claim 1, wherein a distance between a center of the first circular region and a center of the second circular region is 25 mm.

8. The rack module of claim 1, wherein a distance between a center of the third circular region and a center of the fourth circular region is 31.75 mm.

9. The rack module of claim 1, wherein the first plate and the second plate lie in a same plane.

10. The rack module of claim 1, wherein a rack module height is less than 44.45 mm.

11. The rack module of claim 1, wherein a first circular line formed between the first circular region and the second circular region is parallel to a second circular line formed between the third circular region and the fourth circular region.

12. A rack module comprising:
a first plate including a first hole formed by a first oblong region and a first circular region and a second hole formed by a second oblong region and a second circular region; and
a second plate including a third hole formed by a third oblong region and a third circular region and a fourth hole formed by a fourth oblong region and a fourth circular region,
wherein:
a first circular distance is defined between a center of the first circular region and a center of the second circular region;
a second circular distance is defined between a center of the third circular region and a center of the fourth circular region; and
the first circular distance is less than the second circular distance,
and further wherein a diameter common to each of the first circular region, the second circular region, the third circular region, and the fourth circular region is smaller than a width common to each of the first oblong region, the second oblong region, the third oblong region, and the fourth oblong region.

13. A rack module comprising:
a first plate including a first oblong hole and a first circular hole separate from the first oblong hole and a second oblong hole and a second circular hole separate from the second oblong hole; and
a second plate including a third oblong hole and a third circular hole separate from the third oblong hole and a fourth oblong hole and a fourth circular hole separate from the fourth oblong hole,
wherein:
a first circular distance is defined between a center of the first circular hole and a center of the second circular hole;
a second circular distance is defined between a center of the third circular hole and a center of the fourth circular hole;
the first circular distance is less than the second circular distance,
the first circular hole is horizontally aligned with the third oblong hole,
the third circular hole is horizontally aligned with the first oblong hole,
the second circular hole is horizontally aligned with the fourth oblong hole, and
the fourth circular hole is horizontally aligned with the second oblong hole.

14. The rack module of claim 13, wherein:
the first circular hole is vertically aligned with the second circular hole, and
the third circular hole is vertically aligned with the fourth circular hole.

15. The rack module of claim 13, wherein a diameter common to each of the first circular hole, the second circular hole, the third circular hole, and the fourth circular hole is smaller than a width common to each of the first oblong hole, the second oblong hole, the third oblong hole, and the fourth oblong hole.

16. The rack module of claim 13, wherein each of the first circular hole, the second circular hole, the third circular hole, and the fourth circular hole is arranged at a center along the longitudinal axis of the corresponding first oblong hole, second oblong hole, third oblong hole, and fourth oblong hole.

17. The rack module of claim 13, wherein each of the first circular hole, the second circular hole, the third circular hole, and the fourth circular hole is arranged at an end along the longitudinal axis of the corresponding first oblong hole, second oblong hole, third oblong hole, and fourth oblong hole.

18. The rack module of claim 13, wherein a distance between a center of the first circular hole and a center of the second circular hole is 25 mm.

19. The rack module of claim 13, wherein a distance between a center of the third circular hole and a center of the fourth circular hole is 31.75 mm.

20. The rack module of claim 13, wherein the first plate and the second plate lie in a same plane.

21. The rack module of claim 13, wherein a rack module height is less than 44.45 mm.

22. The rack module of claim 13, wherein a first circular line formed between the first circular hole and the second circular hole is parallel to a second circular line formed between the third circular hole and the fourth circular hole.

23. A rack module comprising:
a first plate including a first oblong hole and a first circular hole separate from the first oblong hole and a second oblong hole and a second circular hole separate from the second oblong hole; and
a second plate including a third oblong hole and a third circular hole separate from the third oblong hole and a fourth oblong hole and a fourth circular hole separate from the fourth oblong hole,
wherein:
a first circular distance is defined between a center of the first circular hole and a center of the second circular hole;
a second circular distance is defined between a center of the third circular hole and a center of the fourth circular hole; and
the first circular distance is less than the second circular distance
and further wherein:
a first oblong distance is defined between a center of the first oblong hole and a center of the second oblong hole;
a second oblong distance is defined between a center of the third oblong hole and a center of the fourth oblong hole;

the first circular distance equals the second oblong distance, and
the second circular distance equals the first oblong distance.

24. A rack module comprising:
a first plate including a first oblong hole and a first circular hole separate from the first oblong hole and a second oblong hole and a second circular hole separate from the second oblong hole; and
a second plate including a third oblong hole and a third circular hole separate from the third oblong hole and a fourth oblong hole and a fourth circular hole separate from the fourth oblong hole,
wherein:
a first circular distance is defined between a center of the first circular hole and a center of the second circular hole;
a second circular distance is defined between a center of the third circular hole and a center of the fourth circular hole; and
the first circular distance is less than the second circular distance
and further wherein a diameter common to each of the first circular hole, the second circular hole, the third circular hole, and the fourth circular hole equals a width common to each of the first oblong hole, the second oblong hole, the third oblong hole, and the fourth oblong hole.

* * * * *